(12) United States Patent
Berlemont (10) Patent No.: US 7,268,473 B2
(45) Date of Patent: Sep. 11, 2007

(54) PIEZOELECTRIC ACTUATOR (75) Inventor: Jean-Francois Berlemont, Brussels (BE)

(73) Assignee: Delphi Technologies, Inc., Troy, MI (US)

( * ) Notice: Subject to any disclaimer, the term of this patent is extended or adjusted under 35 U.S.C. 154(b) by 122 days.

(21) Appl. No.: 11/146,256

(22) Filed: Jun. 6, 2005

(65) Prior Publication Data
US 2005/0269914 A1 Dec. 8, 2005

(30) Foreign Application Priority Data
Jun. 7, 2004 (EP) .................. 04253390

(51) Int. Cl.
H01L 41/083 (2006.01)
H01L 41/047 (2006.01)
(52) U.S. Cl. ............. 310/366; 310/365; 310/317
(58) Field of Classification Search ........ 310/317, 310/328, 365, 366
See application file for complete search history.

(56) References Cited
U.S. PATENT DOCUMENTS
4,652,848 A  3/1987  Hundrieser
4,680,670 A  7/1987  Chan FOREIGN PATENT DOCUMENTS
EP      0179978        5/1986
JP      62-165380    *  7/1987    ............. 310/328
JP      4166641      *  6/1992
JP      04367288        12/1992
JP      5-160459     *  6/1993
WO      WO 2004/010511    1/2004

* cited by examiner

Primary Examiner—Thomas M. Dougherty
(74) Attorney, Agent, or Firm—David P. Wood (57) ABSTRACT

The invention provides a piezoelectric actuator having a stack body comprising a plurality of piezoelectric elements, each element having a positive and negative electrode pair which are electrically isolated from one another by the piezoelectric elements, the electrode pairs being arranged in groups of one or more electrode pairs, each group having a conducting arrangement in electrical connection therewith. The piezoelectric actuator further comprises a distribution electrode arrangement for connecting the conducting arrangement to a power supply, in use, wherein the distribution electrode arrangement includes a fuse arrangement. In the event of a short circuit between electrodes of a pair within one of the groups, the fuse arrangement breaks the electrical connection between the power supply and the conducting arrangement.

20 Claims, 5 Drawing Sheets

PIEZOELECTRIC ACTUATOR

TECHNICAL FIELD

The invention relates to a piezoelectric actuator, more particularly a multilayer piezoelectric stack-type actuator for use in an injector of an internal combustion engine. The invention also relates to a distribution electrode suitable for use with a multilayer piezoelectric stack-type actuator.

BACKGROUND OF THE INVENTION

Piezoelectric fuel injectors generally employ piezoelectric actuators comprised of a stack of piezoelectric elements, arranged mechanically in series, to open and close an injection valve in order to inject fuel into a combustion space. Typically, a piezoelectric actuator is located in a chamber, defined by an injector housing, which contains fuel at injection pressures. The piezoelectric actuator controls movement of the injection valve either by means of a mechanical or hydraulic coupling. An example of one such piezoelectric fuel injector is disclosed in U.S. Pat. No. 6,520,423.

Figure 1:
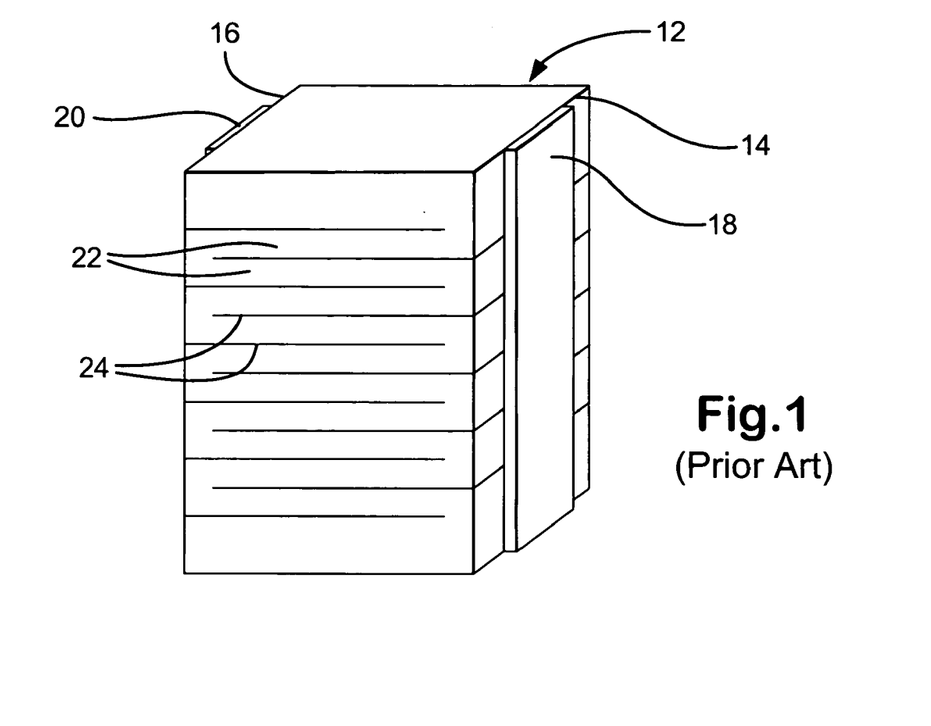
FIG. 1 is a perspective view of a known multilayer piezoelectric actuator.

A typical multi-layer piezoelectric actuator or stack is shown in FIG. 1 and comprises a stack body 12, which is generally rectangular in cross section, having first and second opposing outer faces 14, 16. The opposing faces 14, 16 of the stack body 12 are provided with first and second conductors or distribution electrodes 18, 20 respectively. The stack body 12 comprises a plurality of relatively thin piezoelectric ceramic layers or elements 22, each of which is spaced from adjacent elements 22 by an internal electrode 24. Alternate ones of the internal electrodes 24 are electrically connected to the first distribution electrode 18 and second distribution electrode 20, respectively, to form two groups of electrodes, whereby the electrodes of one group are interdigitated with the electrodes of the other group.

Figure 2:
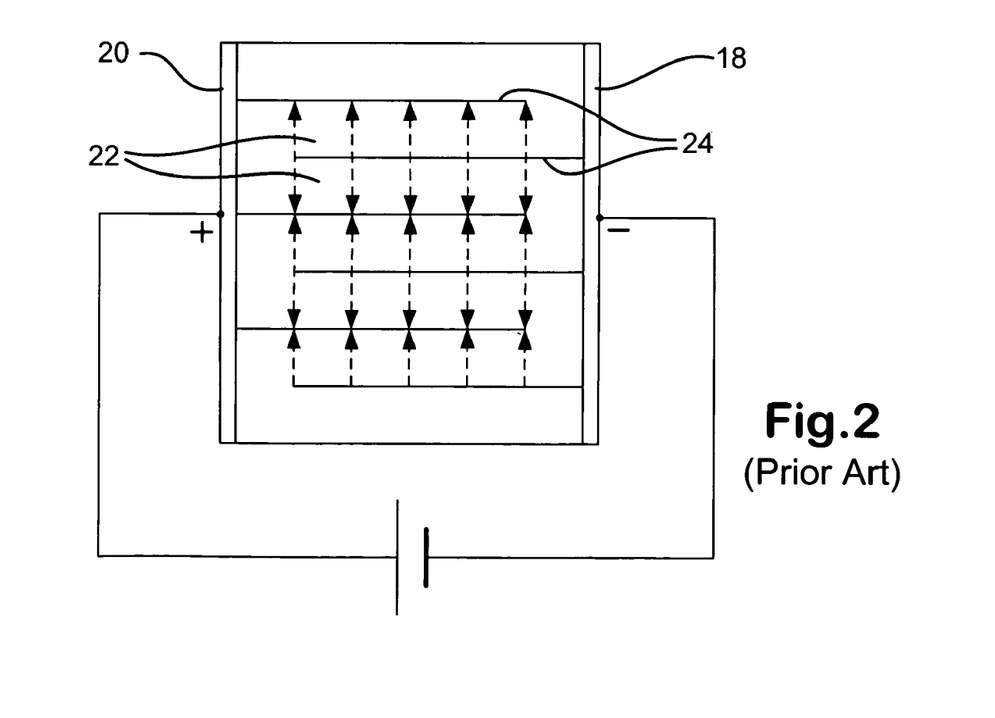
FIG. 2 is a schematic view of the piezoelectric actuator of FIG. 1.

With reference to FIG. 2, a voltage is applied, in use, across the two distribution electrodes 18, 20 whereby an adjacent pair of internal electrodes 24 sandwiching a piezoelectric element 22 become mutual conductors of opposite polarity and apply an electric field to the intermediate element 22. Put another way, the distribution electrodes 18, 20 serve to distribute charge to each group of the internal electrodes 24 to which they are connected. When an electric field is applied to the distribution electrodes 18, 20, the piezoelectric actuator will elongate (if the piezoelectric actuator is of the energise-to-extend type) or contract (if the piezoelectric actuator is of the de-energise-to-extend type) along its longitudinal axis.

It will be appreciated that each piezoelectric element 22 is a dielectric material, such that it is a poor conductor of electrical charge and, therefore, serves to insulate opposing internal electrodes 24 whilst supporting electric fields generated therebetween. Typically, each piezoelectric element 22 has a thickness of around 100 µm, so a sufficient electric field strength of, for example, 2 kV/mm can be attained between the internal electrodes 24 by way of a relatively low applied voltage of 200V, whilst still obtaining the required elongation or contraction of the actuator stack. However, if the voltage across a piezoelectric element 22 becomes too great, that is to say if the electric field becomes too intense, the dielectric material will begin to breakdown and so will conduct electric current.

Dielectric breakdown of the piezoelectric elements in multilayer stack-type actuators severely affects actuator functionality. For instance, dielectric breakdown of just one piezoelectric element will cause a low resistance (short circuit) path between two opposing internal electrodes 24. Since the internal electrodes 24 are connected in parallel with the distribution electrodes 18, 20, the electric field in each element 22 will dissipate as charge is no longer distributed to the unaffected internal electrodes 24. Therefore, the piezoelectric actuator is rendered inoperative.

Dielectric breakdown also causes permanent structural damage to the piezoelectric actuator. This is due to the high current flowing through the short circuit path elevating the temperature of the surrounding ceramic material to such an extent as to cause melting of the ceramic elements 22 and the internal electrodes 24 of the piezoelectric actuator.

SUMMARY OF THE INVENTION

It is an object of the present invention to provide a piezoelectric actuator which substantially avoids or at least alleviates some of the aforementioned problems.

According to the present invention, there is provided a piezoelectric actuator having a stack body comprising a plurality of piezoelectric elements, each element having a positive and negative electrode pair which are electrically isolated from one another by the piezoelectric elements, the electrode pairs being arranged in groups of one or more electrode pairs, each group having a conducting arrangement in electrical connection therewith. The piezoelectric actuator further comprises a distribution electrode arrangement for connecting the conducting arrangement to a power supply, in use, wherein the distribution electrode arrangement includes a fuse arrangement. In the event of a short circuit between electrodes of a pair within one of the groups, the fuse arrangement breaks the electrical connection between the power supply and the conducting arrangement.

As the distribution electrode arrangement serves to disconnect said one of the groups of internal electrodes from the power supply, the remaining groups are unaffected by the short circuit in said one of the groups. As a consequence, functionality of the piezoelectric actuator is substantially retained as the actuator may still operate with the remaining operational elements. It will be appreciated that since the piezoelectric elements associated with said one of the groups of internal electrodes will no longer be subjected to an electric field, those elements will no longer contribute to the overall expansion and contraction of the piezoelectric actuator. As a consequence, the functionality of the actuator will decrease slightly. However, this decrease in performance may be compensated for automatically by the control electronics.

Although it is envisaged that, in a practical embodiment, each of the aforementioned groups may include a plurality of electrode pairs, each group may include a single pair of electrodes only.

The conducting arrangement may comprise a plurality of positive conductors, each being in electrical connection with the positive electrodes of a respective group, and a plurality of negative conductors, each being in electrical connection with the negative electrodes of a respective group. Preferably, the positive and negative conductors are in the form of metallised regions formed on respective opposing external faces of the stack body. Likewise, it is preferred that the conducting member and the charge distribution elements are regions of metallisation on respective faces of the substrate.

In use, a voltage is applied to the conducting arrangement by way of the distribution electrode arrangement. The distribution electrode arrangement may include a first distribution electrode associated with the positive conductors and a second distribution electrode associated with the negative conductors. Preferably, each of the first and second distribution electrodes includes an insulating substrate having first and second opposing side faces, a conducting member disposed on the first face of the substrate and a plurality of charge distribution elements disposed on the second face of the substrate, wherein the conducting member is electrically connectable to the power supply and the charge distribution elements are connected to the positive and negative conductors. It is preferred that the conducting member and the charge distribution elements are regions of metallisation on respective faces of the substrate. Preferably, the substrate is a substantially planar or flat layer.

In order to establish an electrical connection between the conductor member and the charge distribution elements, the substrate may include a plurality of bores extending from the first face to the second face of the substrate, each of the bores corresponding to a respective one of the charge distribution elements.

In the preferred embodiment of the invention, the fuse arrangement includes a plurality of conducting arms extending perpendicularly away from the conducting member, each of the conducting arms corresponding to a respective one of the charge distribution elements.

Further, the substrate may include a plurality of bores extending between the first and second faces of the substrate, each bore corresponding to a respective charge distribution element. A conducting piece may be received by each bore, each conducting piece electrically connecting ones of the conducting arms with a respective charge distribution element.

Although the conducting members, charge distribution elements and fuse arrangement may be manufactured otherwise, in practice, the aforementioned items are formed conveniently by an electroless plating process.

From another aspect, there is provided a piezoelectric actuator having a stack body comprising a plurality of piezoelectric elements, each element having a positive and negative electrode pair which are electrically isolated from one another by the piezoelectric elements, the electrode pairs being arranged in groups of one or more electrode pairs, a positive conductor being in connection with the positive electrodes of a respective group, and a negative conductor being in connection with the negative electrodes of a respective group. The piezoelectric actuator further comprises a first distribution electrode associated with each positive conductor, a second distribution electrode associated with each negative conductor wherein each of the first and second distribution electrodes comprises an insulating substrate having first and second opposing faces, a conducting member disposed on the first face of the substrate and a plurality of charge distribution elements disposed on the second face of the substrate, wherein the conducting member is electrically connectable with the power supply, in use, and the charge distribution elements are connected to the positive and negative conductors. Each of the first and second distribution electrodes further comprises a fuse arrangement providing an electrical connection between the conducting member and the charge distribution elements whereby, in the event of a short circuit between electrodes of a pair within one of the groups, the fuse arrangement breaks the electrical connection between the power supply and the positive and negative conductors.

From another aspect, the invention resides in a distribution electrode for use with a piezoelectric actuator having a stack body comprising a plurality of piezoelectric elements, each element having a positive and negative electrode pair which are electrically isolated from one another by the piezoelectric element. The distribution electrode comprises an insulating substrate having first and second opposing faces, a conducting member disposed on the first face, the conducting member being electrically connectable with a power supply and a plurality of charge distribution elements disposed on the second face. The charge distribution elements are electrically connectable with the positive and negative internal electrodes of the stack body. The distribution electrode further comprises a fuse arrangement providing an electrical connection between the conducting member and each charge distribution elements.

BRIEF DESCRIPTION OF DRAWINGS

In order that it may be more readily understood, the invention will now be described, by way of example only, with reference to the accompanying drawings in which.

DESCRIPTION OF THE PREFERRED EMBODIMENTS

Figure 3:
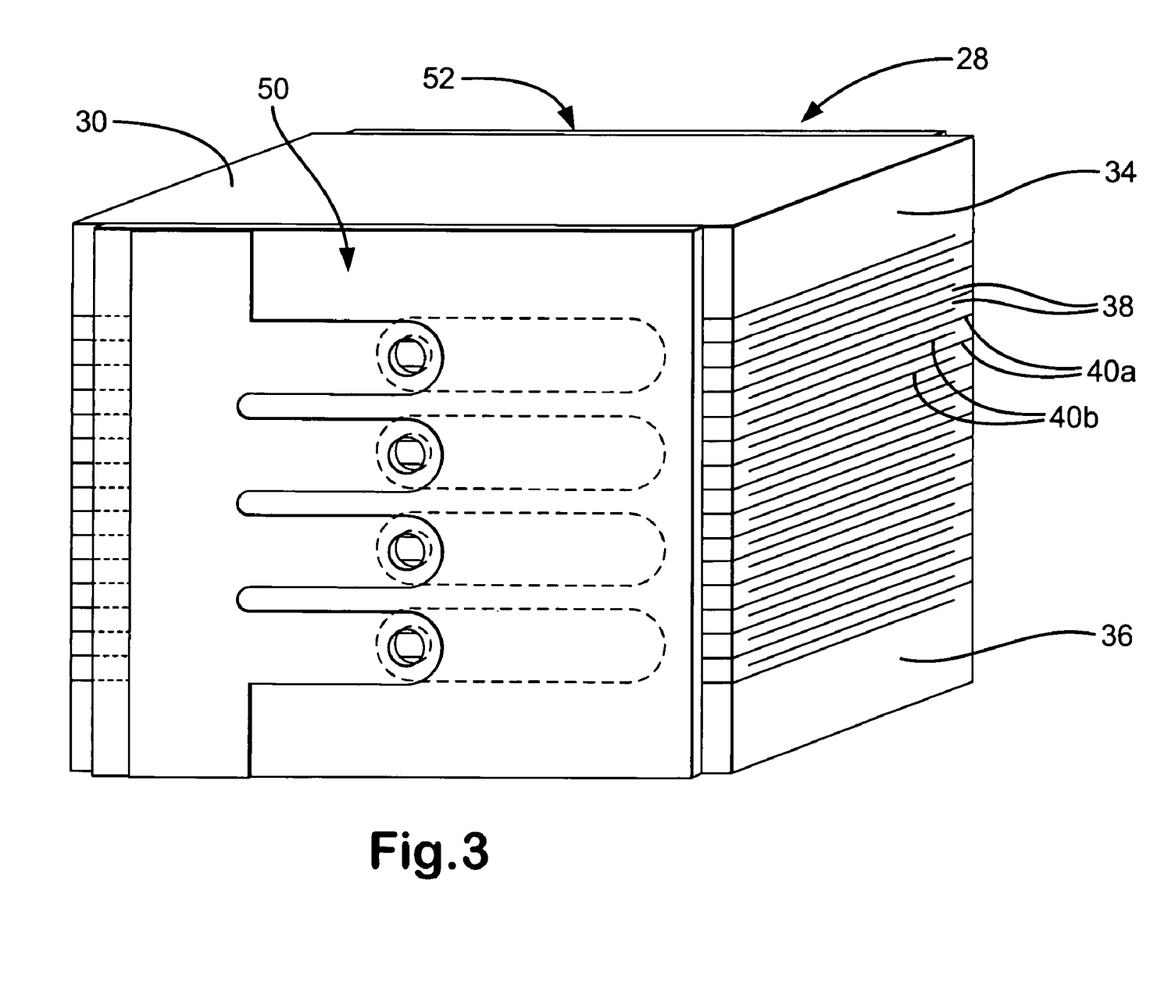
FIG. 3 is a perspective view of a piezoelectric actuator in accordance with a first embodiment of the present invention.
Figure 4A:
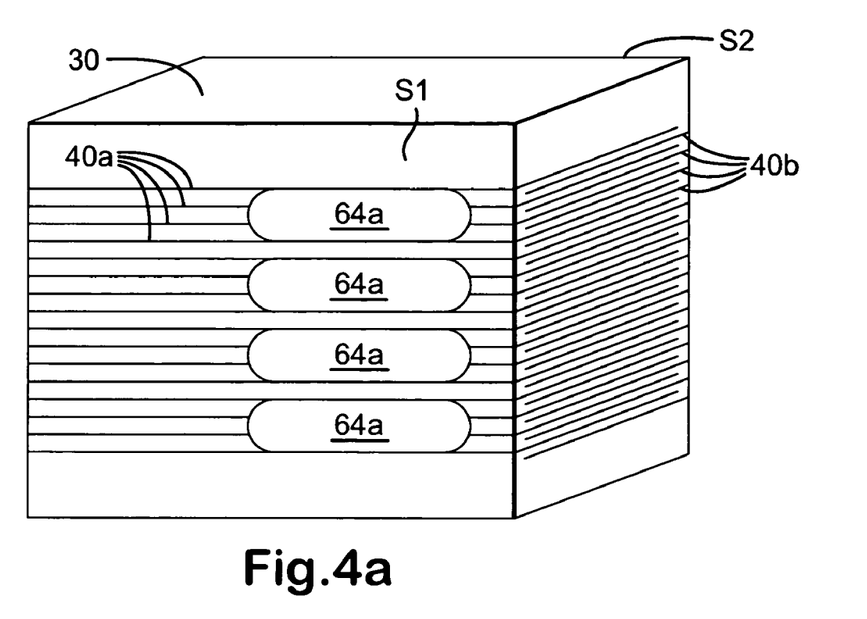
FIGS. 4a and 4b are perspective views of opposing faces of the piezoelectric actuator of FIG. 3 with distribution electrodes thereof removed.
Figure 4B:
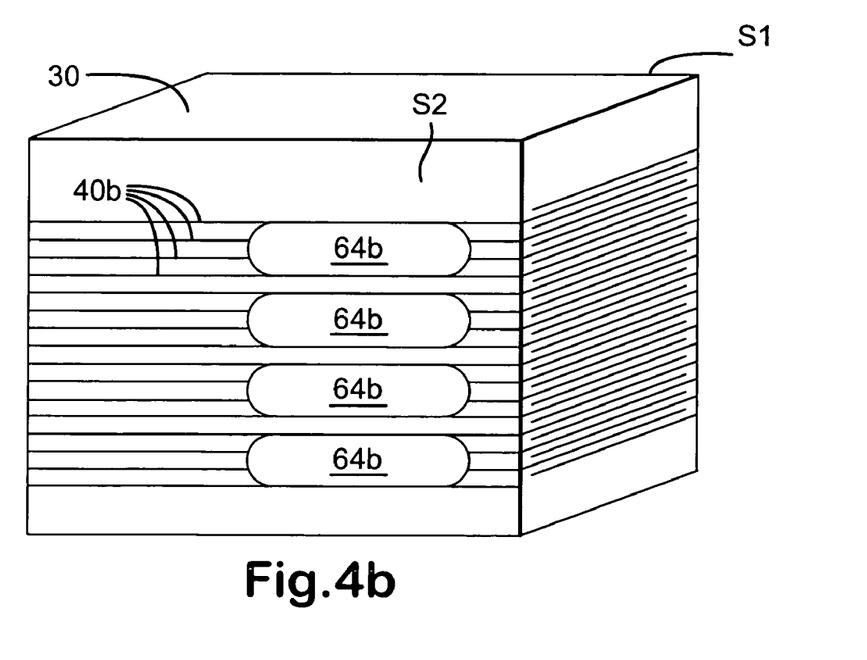

Referring firstly to FIGS. 3 and 4, there is shown a piezoelectric actuator 28 having a stack body 30 comprising a plurality of piezoelectric layers or elements 38 disposed between first and second end pieces 34, 36. The piezoelectric elements 38 and the end pieces 34, 36 are in the form of plates or tiles. However, this need not be the case and the first and second end pieces 34, 36, in particular, may take a different form such as a dome or cap, should it be required for a particular application. It should be mentioned that the dimensions of the stack and associated components are exaggerated in the Figures for the sake of clarity.

Adjacent elements 38 of the stack body 30 are spaced apart by positive and negative internal electrodes 40a, 40b which are arranged so as to be substantially co-planar to the first and second end pieces 34, 36 of the stack body 30. In a conventional manner, the elements 38 and the internal electrodes 40a, 40b are stacked in such a way that alternate ones of the electrodes 40a, 40b form a first group of electrodes and the remaining alternate ones of the electrodes 40a, 40b form a second group of electrodes, whereby the electrodes of one group are interdigitated with the electrodes of the other group. Distribution electrode means in the form of first and second distribution electrodes 50, 52, of rectangular form, are disposed on the front and rear faces S1, S2 of the stack body, respectively. The distribution electrodes 50, 52 serve to distribute electrical charge to the electrodes 40a, 40b.

Although in this description, the piezoelectric actuator is described with reference to its front, rear and opposing side faces, it should be mentioned that this does not limit the piezoelectric actuator to any particular orientation.

FIGS. 4a and 4b show the opposing front and rear faces S1, S2 of the stack body 30 with the distribution electrodes 50, 52 removed. The opposing front and rear faces S1, S2 of the stack body 30 bear contact means in the form of elongate metallised conducting regions 64a, 64b, respectively.

By virtue of the construction of the stack body 30, the regions 64a, 64b extend across their respective faces S1, S2 so that selected ones of the positive internal electrodes 40a are connected to the metallised regions 64a and selected ones of the negative internal electrodes are connected to the metallised regions 64b. The metallised regions 64a and 64b are considered to be positive and negative conductor pads 64a, 64b, respectively.

Figure 5A:
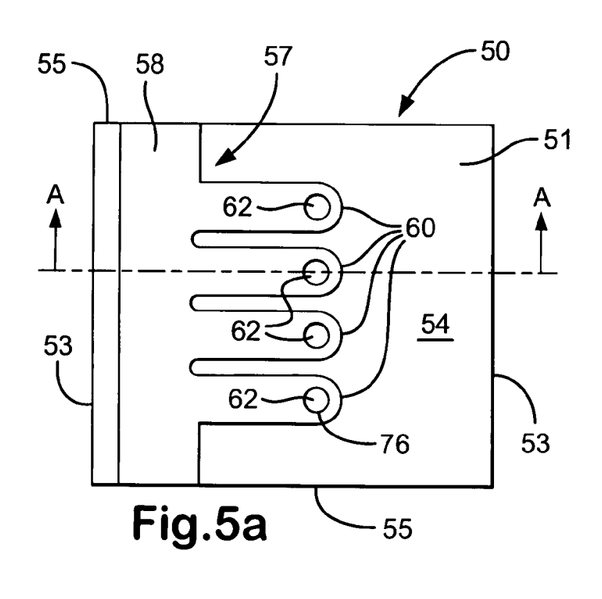
FIGS. 5a and 5b show opposing faces of a distribution electrode of FIG. 3.
Figure 5B:
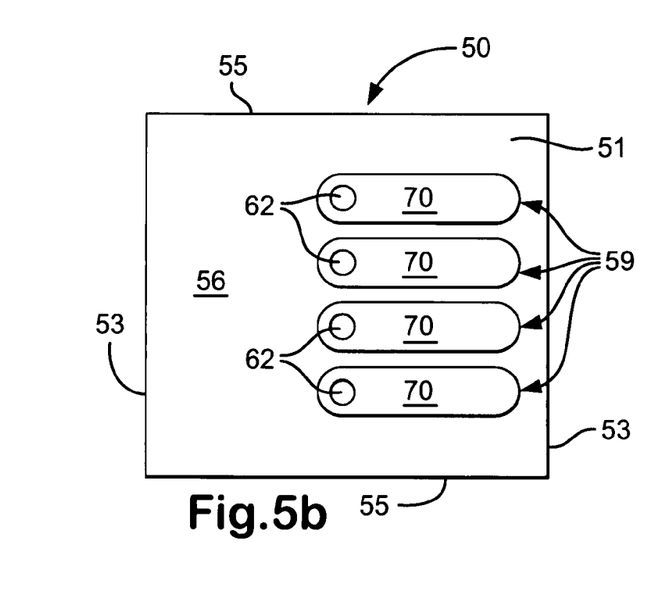
Figure 6:
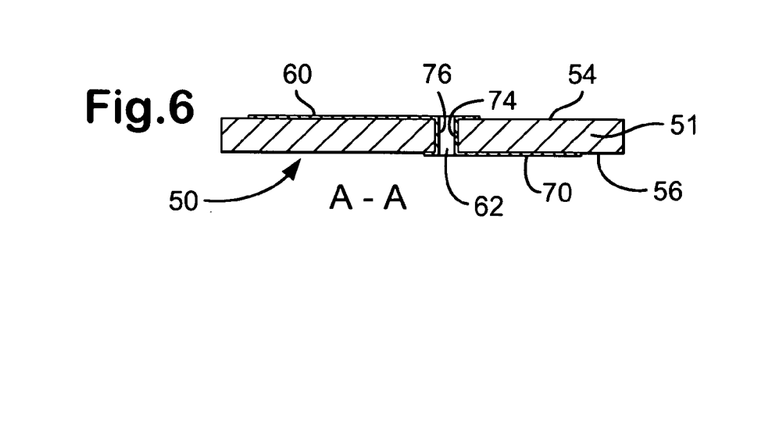
FIG. 6 is a sectional view of the distribution electrode in FIG. 5a along line A-A.

Turning now to FIGS. 5a, 5b and 6, there is shown a distribution electrode means 50 (as in FIG. 3) removed from the stack body 30. Since both distribution electrodes 50, 52 are, in essence, identical, hereinafter reference shall be made to a single distribution electrode 50 for the sake of clarity.

The distribution electrode 50 comprises a plastics substrate layer 51 of rectangular form having generally parallel longitudinal and lateral edges 53, 55 and opposing first and second planar faces 54, 56, each one of the opposing faces 54, 56 bearing respective metallised regions, shown generally as 57 and 59 respectively. It will be appreciated that the substrate layer 51 serves to insulate each one of the metallised regions 57, 59 from the other. In this embodiment, the substrate layer 51 is a polyimide film such as Kapton® by DuPont. However, it should be appreciated that other materials are also envisaged as appropriate for the substrate layer 51, for example, polymers such as PTFE, PFA and ETFE.

The metallised region 57 on the first face 54 includes a conducting member in the form of a busbar 58 running proximal to, and generally parallel with, a longitudinal edge 53 (left hand edge as shown in FIG. 5a) of the substrate layer 51. Four conducting arms 60 extend perpendicularly away from the busbar 58 so as to traverse the first face 54 of the substrate layer 51, each conducting arm 60 terminating approximately midway across the first face 54 at a rounded end.

It should be mentioned at this point that although the conducting arms 60 are shaped so as to terminate approximately midway across the first face 54, it will be appreciated that the arrangement shown is merely for illustrative purposes and the dimensions of the metallised region 57 may be altered to suit a particular application, as required.

Referring now to FIG. 5b, the second face 56 of the substrate layer 51 bears a plurality of elongate metallised regions 59 in the form of charge distribution elements or segments 70, each having a first end proximal to the longitudinal edge 53 opposing the busbar 58 (right hand edge as shown). Each charge distribution segment 70 has a second end which terminates approximately midway across the second face 56 such that the segments 70 extend generally parallel to the lateral edges 55 of the substrate layer 51. Each one of the segments 70 is aligned with a corresponding one of the conducting arms 60 such that their respective terminated ends are superimposed, one above the other.

Four bores 62 extend through the substrate layer 51, each bore 62 coinciding with the superimposed terminated ends of the conducting arms 60 and their associated segments 70. FIG. 6 shows the position of a single one of the bores 62 more clearly, where it can be seen that the internal surface 74 of each bore 62 also bears a metallic coating to form an electrical connecting piece 76 in the form of a ring. The electrical connecting piece 76 establishes an electrical connection between each conducting arm 60 and its associated segment 70.

The distribution electrode 50 may be fabricated as follows. Initially, the substrate layer 51 is formed to a predefined shape, as required by a particular application. The bores 62 may then be formed in the substrate layer 51 by an appropriate technique such as laser drilling. Following the formation of the bores 62 in the substrate layer 51, a chemical catalyst is applied to the substrate layer 51 which enables formation of a metallised layer. The chemical catalyst reacts to incident UV light shone through an appropriately formed photo mask so that only the necessary regions are activated. Alternatively, a laser technique for catalyst activation may be used, such technique being known to appropriately skilled persons. Finally, by way of a conventional electroless plating process, a metallic coating is deposited on the activated areas, including the internal surface 74 of the bore 62.

The distribution electrode 50 is attached to the stack body 30 by way of a conductive glue or polymer applied between the charge distribution segments 70 and the conductor pads 64a, 64b of the stack body 30. The conductive glue/polymer optimises the electrical connection whilst providing sufficient adhesion of the distribution electrode 50 to the stack body 30.

Therefore, a conductive path is established between a power supply (not shown) and the internal electrodes 40a, 40b of the stack body 30 through the distribution electrodes 50, 52. It will be appreciated that the distribution electrodes 50, 52 may also be attached to the stack body by other methods e.g. by soldering or brazing for example.

In order for an electric field to be established in the piezoelectric elements 38, the busbar 58 of each distribution electrode 50, 52 is connected to opposite polarities, respectively, of an electrical supply arrangement (not shown). By way of explanation, electrical connectors may extend from an end cap (not shown) disposed above the stack body 30, each electrical connector being attached to a busbar 58, by soldering for example. The voltage applied to the distribution electrodes 50, 52 may be controlled by a conventional power supply arrangement.

In use, if a short circuit occurs between opposing internal electrodes 40a, 40b due to dielectric breakdown of the sandwiched piezoelectric element 38, the specific conducting arm 60 supplying excessive current to the group of internal electrodes 40a, 40b, of which the affected element is a member, will function as a fuse and serve to isolate the group of internal electrodes 40a, 40b from the electrical supply. The dimensions of the conducting arms 60 are selected so as to have a pre-determined current threshold such that if the current threshold is exceeded in a particular conducting arm 60, the conducting arm 60 will burn such that the electrical connection between the busbar 58 and one of the conductor pads 64a, 64b is broken.

Since a damaged piezoelectric element 38, and its associated group elements only, are isolated from the power supply, the electrical supply to the remaining groups of internal electrodes is unaffected. Therefore, the majority of the piezoelectric elements retain their functionality.

In this embodiment, each conducting arm 60 electrically connects a group of four internal electrodes (i.e. a group of four positive electrodes 40a and a group of four negative electrodes 40b) and so a short circuit of one element 38 in the group will cause loss of nine elements 38 in total. However, the loss of nine elements is negligible in comparison to the total number of elements typically employed in a piezoelectric actuator and so the marginal loss of actuator functionality may be compensated for by the associated power supply.

Figure 7:
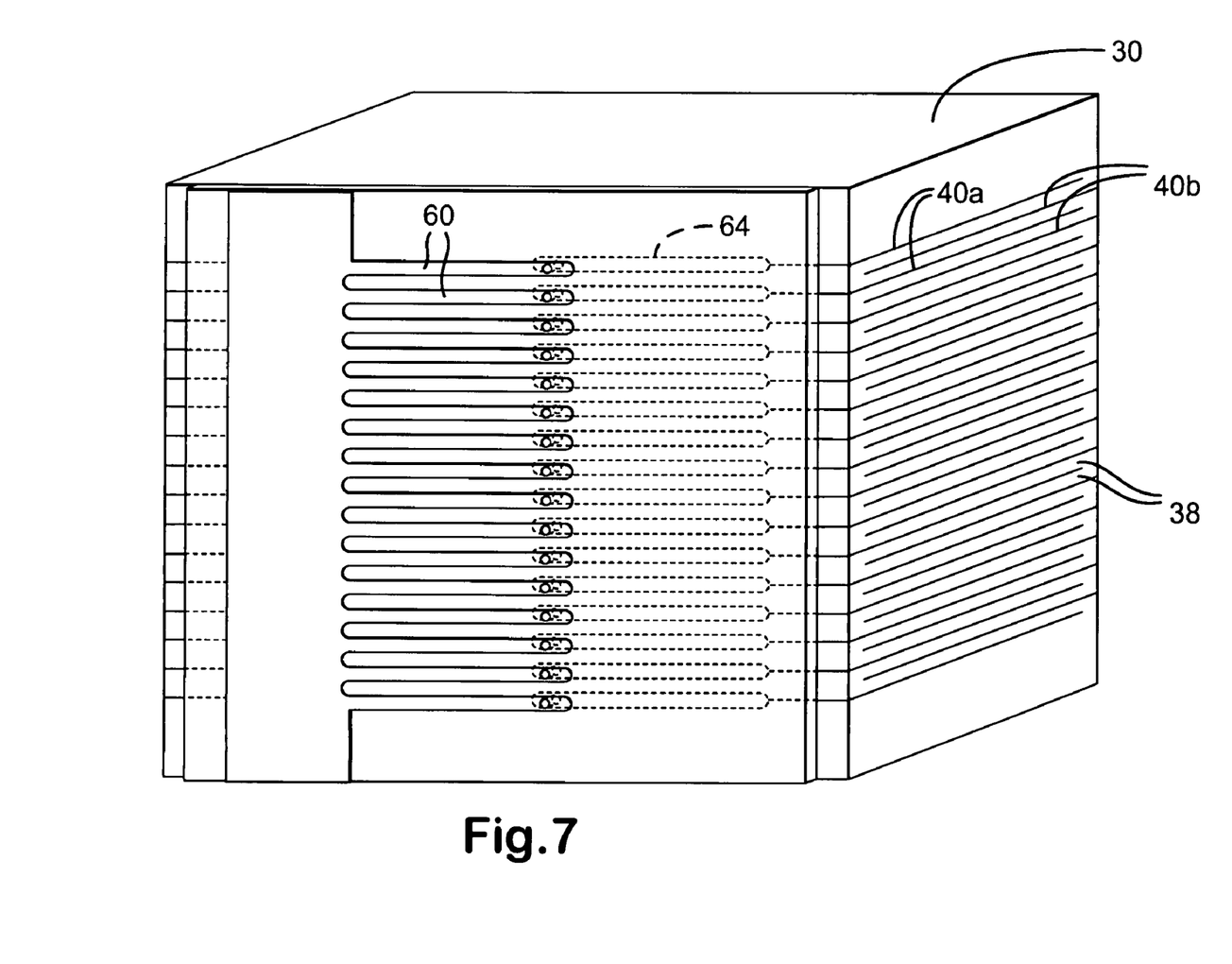
FIG. 7 is a perspective view of a piezoelectric actuator in accordance with a second embodiment of the present invention.

FIG. 7 shows an alternative embodiment of the invention, in which like parts are denoted by like reference numerals, where appropriate. In the previous embodiment of the invention, although the majority of the piezoelectric elements 38 remain operable following a short circuit between two opposing internal electrodes 40a, 40b, a partial loss of functionality of the piezoelectric actuator may still occur if the supply electronics cannot compensate fully for the loss of the elements 38; for example, if numerous groups of internal electrodes 40a, 40b are isolated due to several short circuited elements 38. In FIG. 7, the stack body 30 (greatly exaggerated for clarity) shows the positive and negative conductor pads 64 of the stack body 30 dedicated to only one internal electrode 40a or 40b, respectively, rather than connecting four internal electrodes as in the previous embodiment. Therefore, if dielectric breakdown occurs in a piezoelectric element 38, only the conducting arm 60 associated with the single associated internal electrode 40a, 40b will fuse. This will result in the loss of functionality of three piezoelectric elements 38 only.

Having described particular preferred embodiments of the present invention, it is to be appreciated that the embodiments in question are exemplary only and that variations and modifications will occur to those possessed of the appropriate knowledge and skills. Accordingly, alterations may be made without departing from the scope of the invention as set forth in the appended claims. For example, in the above described embodiments, the distribution electrodes 50, 52 connect groups of either one or four internal electrode layers 40a, 40b. However, it will be appreciated that the invention is equally applicable to the case where the distribution electrodes 50, 52 and the conductor pads 64a, 64b are formed so as to electrically connect many more internal electrode layers 40a, 40b. Equally, although the stack body of the piezoelectric actuator shown in FIGS. 3, 4 and 7 comprises thirty-one piezoelectric elements, it should be appreciated that, in practice, a stack body of such a piezoelectric actuator comprises many more elements (typically hundreds).

In addition, it should be understood that although the conducting arms 60 function as fuses in order to isolate individual, or selected groups of, internal electrodes, it is possible that any point between and including the busbar 58 and the connecting pads 64 may provide the fusing function. For example, the fusing function may be provided by the connecting piece 76 within the bore 62 if the excessive current burns through the connecting piece 76 before the conducting arms 60. Alternatively, the substrate layer 51 may be chosen such that its physical properties ensure that the substrate in the region of the bore 62 will "shrink" when the temperature of the substrate rises to a level corresponding to a short circuit of a particular element. In effect, therefore, the internal diameter of the bore 62 will increase such that the connecting piece 76 will fragment and so break electrical connection between the conducting arm 60 and the conductor pads 64a, 64b.

Further, although the conductor pads 64a, 64b are described as extending transversely across a portion of the respective faces S1, S2 of the stack body 30, equally the conductor pads 64a, 64b may extend across substantially the entire width of the associated face S1, S2, as appropriate.

The invention claimed is:

1. A piezoelectric actuator having a stack body comprising a plurality of piezoelectric elements, each element having a positive and negative electrode pair which are electrically isolated from one another by the piezoelectric elements, the electrode pairs being arranged in groups of one or more electrode pairs, each group having a conducting arrangement in electrical connection therewith, the piezoelectric actuator further comprising a distribution electrode arrangement for connecting the conducting arrangement to a power supply, in use, wherein the distribution electrode arrangement includes a fuse arrangement whereby, in the event of a short circuit between electrodes of a pair within one of the groups, the fuse arrangement breaks the electrical connection between the power supply and the conducting arrangements;

wherein the distribution electrode arrangement includes a first distribution electrode associated with the positive electrode and a second distribution electrode associated with the negative electrode; and wherein each of the first and second distribution electrodes includes an insulating substrate having first and second opposing side faces, a conducting member disposed on the first face of the insulating substrate and a plurality of charge distribution elements disposed on the second face of the insulating substrate.

2. The piezoelectric actuator as claimed in claim 1, wherein the conducting arrangement comprises a plurality of positive conductors, each being in electrical connection with the positive electrodes of a respective group, and a plurality of negative conductors, each being in electrical connection with the negative electrodes of a respective group.

3. The piezoelectric actuator as claimed in claim 2, wherein the distribution electrode arrangement includes a first distribution electrode associated with the positive conductors and a second distribution electrode associated with the negative conductors.

4. A piezoelectric actuator having a stack body comprising a plurality of piezoelectric elements, each element having a positive and negative electrode pair which are electrically isolated from one another by the piezoelectric elements, the electrode pairs being arranged in groups of one or more electrode pairs, each group having a conducting arrangement in electrical connection therewith, the piezoelectric actuator further comprising a distribution electrode arrangement for connecting the conducting arrangement to a power supply, in use, wherein the distribution electrode arrangement includes a fuse arrangement whereby, in the event of a short circuit between electrodes of a pair within one of the groups, the fuse arrangement breaks the electrical connection between the power supply and the conducting arrangements:

wherein the conducting arrangement comprises a plurality of positive conductors, each being in electrical connection with the positive electrodes of a respective group, and a plurality of negative conductors, each being in electrical connection with the negative electrodes of a respective group;

wherein the distribution electrode arrangement includes a first distribution electrode associated with the positive conductors and a second distribution electrode associated with the negative conductors; and, wherein each of the first and second distribution electrodes includes an insulating substrate having first and second opposing side faces, a conducting member disposed on the first face of the insulating substrate and a plurality of charge distribution elements disposed on the second face of the insulating substrate, wherein the conducting member is electrically connectable to the power supply and the charge distribution elements are connected to the positive and negative conductors.

5. The piezoelectric actuator as claimed in claim 4, wherein the fuse arrangement includes a plurality of conducting arms extending perpendicularly away from the conducting member, each conducting arm corresponding to a respective one of the charge distribution elements.

6. The piezoelectric actuator as claimed in claim 5, wherein the insulating substrate includes a plurality of bores extending between the first and second opposing side faces of the insulating substrate, each bore corresponding to a respective one of the charge distribution elements, and wherein the fuse arrangement includes a plurality of conducting pieces, each of which is received by a respective one of the bores, each conducting piece electrically connecting ones of the conducting arms with a respective one of the charge distribution elements.

7. A piezoelectric actuator having a stack body comprising: a plurality of piezoelectric elements, each element having a positive and negative electrode pair which are electrically isolated from one another by the piezoelectric elements, the electrode pairs being arranged in groups of one or more electrode pairs; a positive conductor being in connection with the positive electrodes of a respective group; and a negative conductor being in connection with the negative electrodes of a respective group; wherein the piezoelectric actuator further comprises: a first distribution electrode associated with each positive conductor; a second distribution electrode associated with each negative conductor; wherein each of the first and second distribution electrodes comprises an insulating substrate having first and second opposing faces, a conducting member disposed on the first face of the substrate and a plurality of charge distribution elements disposed on the second face of the insulating substrate, wherein the conducting member is electrically connectable with the power supply, in use, and the charge distribution elements are connected to the positive and negative conductors, each of the first and second distribution electrodes further comprising a fuse arrangement providing an electrical connection between the conducting member and the charge distribution elements whereby, in the event of a short circuit between electrodes of a pair within one of the groups, the fuse arrangement breaks the electrical connection between the power supply and the positive and negative conductors.

8. The piezoelectric actuator as claimed in claim 7, wherein the positive and negative conductors are metallised regions formed on respective opposing external faces of the stack body.

9. The piezoelectric actuator as claimed in claim 7, wherein the insulating substrate is a substantially planar layer.

10. The piezoelectric actuator as claimed in claim 7, wherein the conducting member and the charge distribution elements are regions of metallisation on respective faces of the insulating substrate.

11. The piezoelectric actuator as claimed in claim 7, wherein the insulating substrate includes a plurality of bores extending between the first and second faces thereof.

12. The piezoelectric actuator as claimed in claim 11, wherein each bore corresponds to a respective one of the charge distribution elements.

13. The piezoelectric actuator as claimed in claim 7, wherein the fuse arrangement includes a plurality of conducting arms extending perpendicularly away from the conducting member, each conducting arm corresponding to a respective one of the charge distribution elements.

14. The piezoelectric actuator as claimed in claim 13, wherein the fuse arrangement further includes a plurality of conducting pieces, each of which is received by a respective one of the bores and electrically connects ones of the conducting arms with a respective one of the charge distribution elements.

15. The piezoelectric actuator as claimed in claim 7, wherein the conducting member is a busbar.

16. A distribution electrode for use with piezoelectric actuator having a stack body comprising a plurality of piezoelectric elements, each element having a positive electrode and a negative electrode pair which are electrically isolated from one another by the piezoelectric element, the distribution electrode comprising an insulating substrate having first and second opposing faces, a conducting member disposed on the first face and a plurality of charge distribution elements disposed on the second face, wherein the conducting member is electrically connectable with a power supply, in use, and the charge distribution elements are electrically connectable with the positive and negative internal electrodes of the stack body, the distribution electrode further comprising a fuse arrangement providing an electrical connection between the conducting member and each of the charge distribution elements.

17. The distribution electrode as claimed in claim 16, wherein the fuse arrangement includes a plurality of conducting arms extending perpendicularly from the conducting member and wherein each conducting arm corresponds to one of the charge distribution elements.

18. The distribution electrode as claimed in claim 16, wherein the insulating substrate includes a plurality of bores extending from the first face to the second thereof and wherein each bore corresponds to a respective one of the charge distribution elements.

19. The distribution electrode as claimed in claim 18, wherein the fuse arrangement further includes a plurality of conducting pieces, each of which is receive by respective ones of the bores.

20. The distribution electrode as claimed in claim 19, wherein each
conducting piece is in the form of a metallised ring.

* * * * *